(12) United States Patent
Tsunoda

(10) Patent No.: US 9,680,481 B2
(45) Date of Patent: Jun. 13, 2017

(54) PHASE DETECTION CIRCUIT AND SIGNAL RECOVERY CIRCUIT THAT INCLUDES PHASE DETECTION CIRCUIT

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/160,513

(22) Filed: May 20, 2016

(65) Prior Publication Data

US 2017/0019114 A1 Jan. 19, 2017

(30) Foreign Application Priority Data

Jul. 14, 2015 (JP) ................................ 2015-140122

(51) Int. Cl.
| | | |
|---|---|---|
| H04L 7/033 | (2006.01) | |
| H03D 3/24 | (2006.01) | |
| H04L 23/00 | (2006.01) | |
| H03L 7/08 | (2006.01) | |
| H03L 7/093 | (2006.01) | |
| H03L 7/091 | (2006.01) | |
| H03L 7/089 | (2006.01) | |
| H04L 27/227 | (2006.01) | |

(52) U.S. Cl.
CPC .......... *H03L 7/0807* (2013.01); *H03L 7/0891* (2013.01); *H03L 7/091* (2013.01); *H03L 7/093* (2013.01); *H04L 27/227* (2013.01)

(58) Field of Classification Search
USPC ....... 375/211, 215, 214, 216, 219, 220, 221, 375/222, 226, 240, 240.26, 240.27, 375/240.29, 239, 271, 259, 279, 284, 285, 375/295, 286, 294, 293, 290, 302, 316, 375/322, 324, 327, 328, 326, 340, 346, 375/354, 362, 371, 373, 374, 375, 376
See application file for complete search history.

(56) References Cited

U.S. PATENT DOCUMENTS

| 5,694,088 A | 12/1997 | Dickson |
| 7,142,622 B1 * | 11/2006 | Brunn .................. H03D 13/004 |
| | | 375/375 |
| 7,423,492 B2 * | 9/2008 | Seefeldt .................. H03L 7/095 |
| | | 327/157 |

(Continued)

FOREIGN PATENT DOCUMENTS

| JP | H07-038505 | 2/1995 |
| JP | H07-240762 | 9/1995 |
| JP | 2003-258924 | 9/2003 |

*Primary Examiner* — Linda Wong
(74) *Attorney, Agent, or Firm* — Fujitsu Patent Center

(57) ABSTRACT

A phase detection circuit includes: a first circuit configured to generate a first phase detection signal that indicates a result of sampling a first clock signal at a transition timing of an input data signal; a second circuit configured to generate a second phase detection signal that indicates a result of sampling a second clock signal at the transition timing of the input data signal, a phase of the second clock signal being different from a phase of the first clock signal; and a third circuit configured to generate a third phase detection signal that indicates a phase of the first clock signal with respect to the input data signal based on the first phase detection signal and the second phase detection signal.

10 Claims, 18 Drawing Sheets

(56) References Cited

U.S. PATENT DOCUMENTS

| | | | |
|---|---|---|---|
| 8,466,716 B2* | 6/2013 | Namba | H03L 1/027 327/105 |
| 2003/0165207 A1 | 9/2003 | Noguchi et al. | |
| 2005/0135471 A1* | 6/2005 | Tonietto | H03L 7/0807 375/233 |
| 2010/0054760 A1* | 3/2010 | Fukuda | H03D 13/003 398/202 |
| 2012/0139593 A1* | 6/2012 | Saito | H03L 7/087 327/156 |
| 2012/0280716 A1* | 11/2012 | Mukherjee | H03D 13/00 327/12 |
| 2015/0349783 A1* | 12/2015 | Shibasaki | H03L 7/0891 331/34 |
| 2016/0142061 A1* | 5/2016 | Hung | H03L 7/081 327/237 |
| 2016/0211855 A1* | 7/2016 | Unruh | H03L 7/1974 |

* cited by examiner

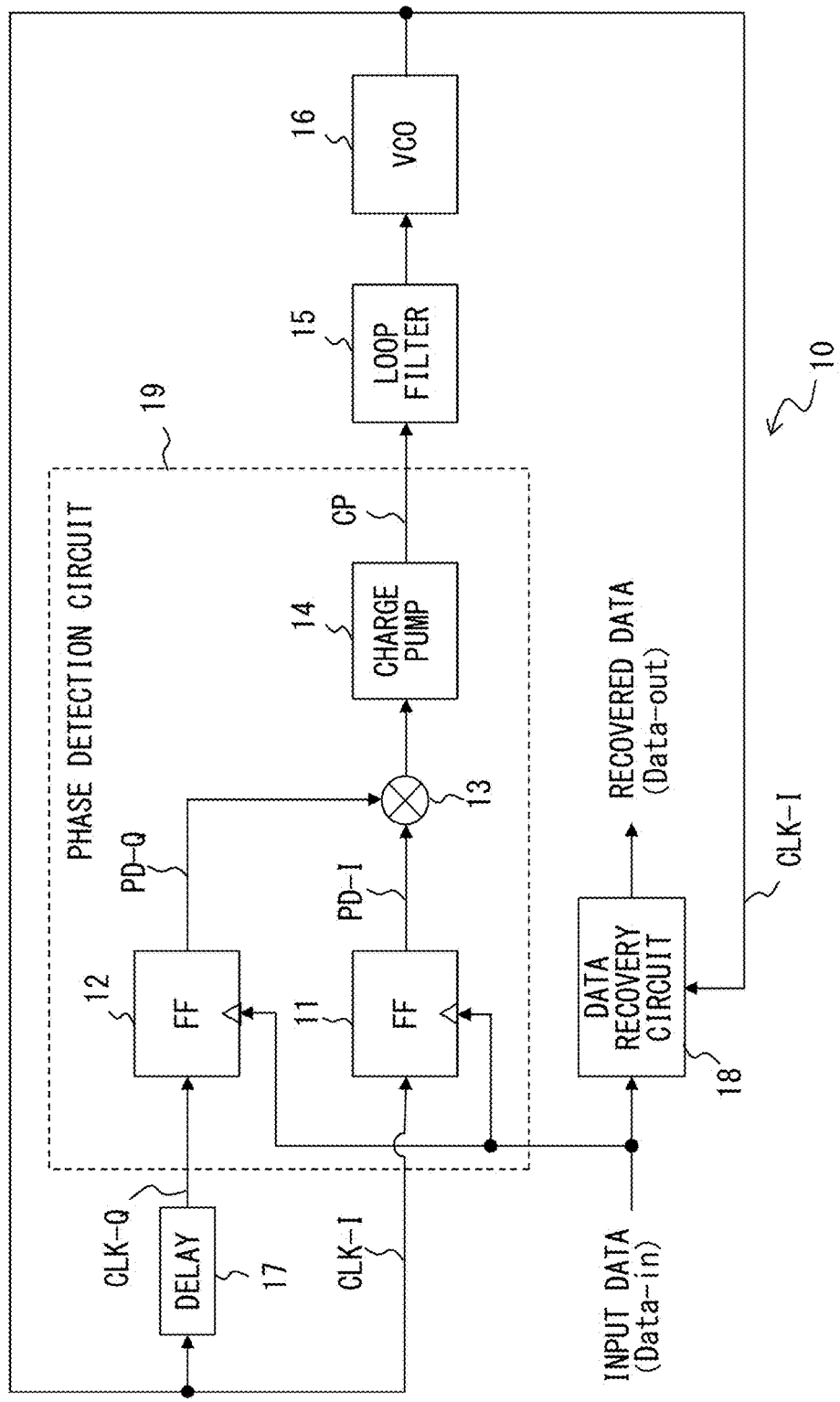
F I G. 2

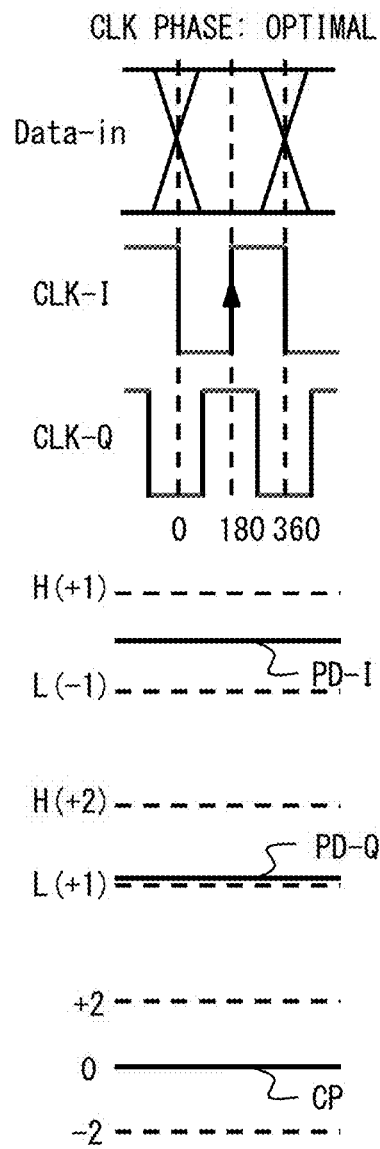
F I G. 3

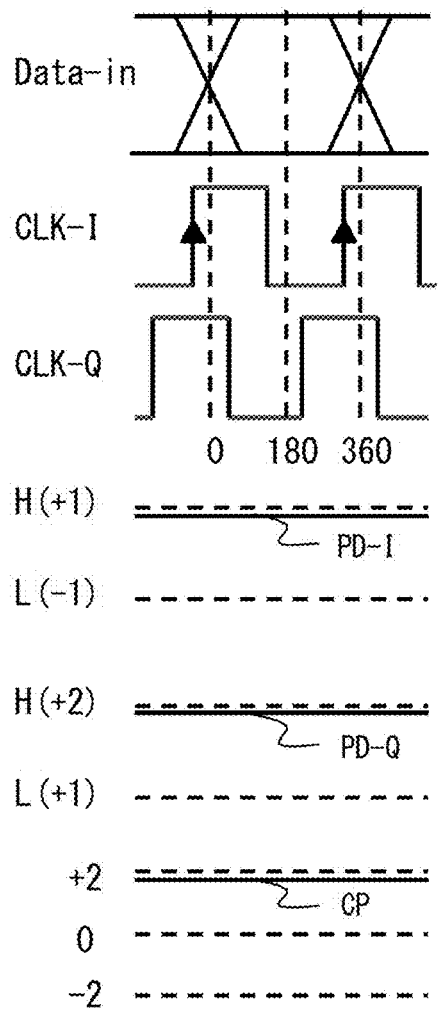
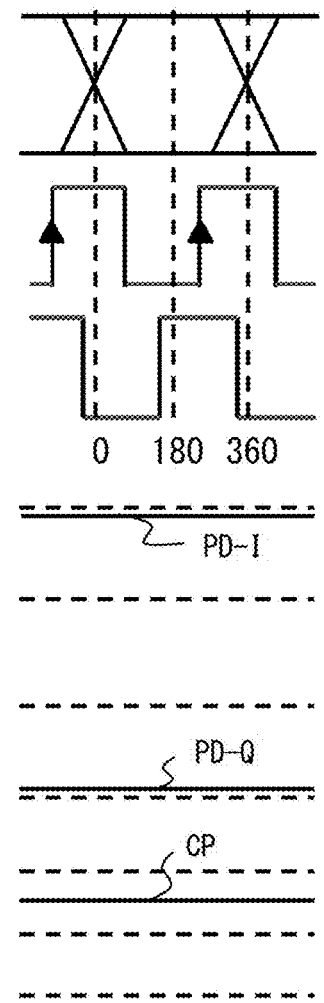
F I G. 4A    F I G. 4B

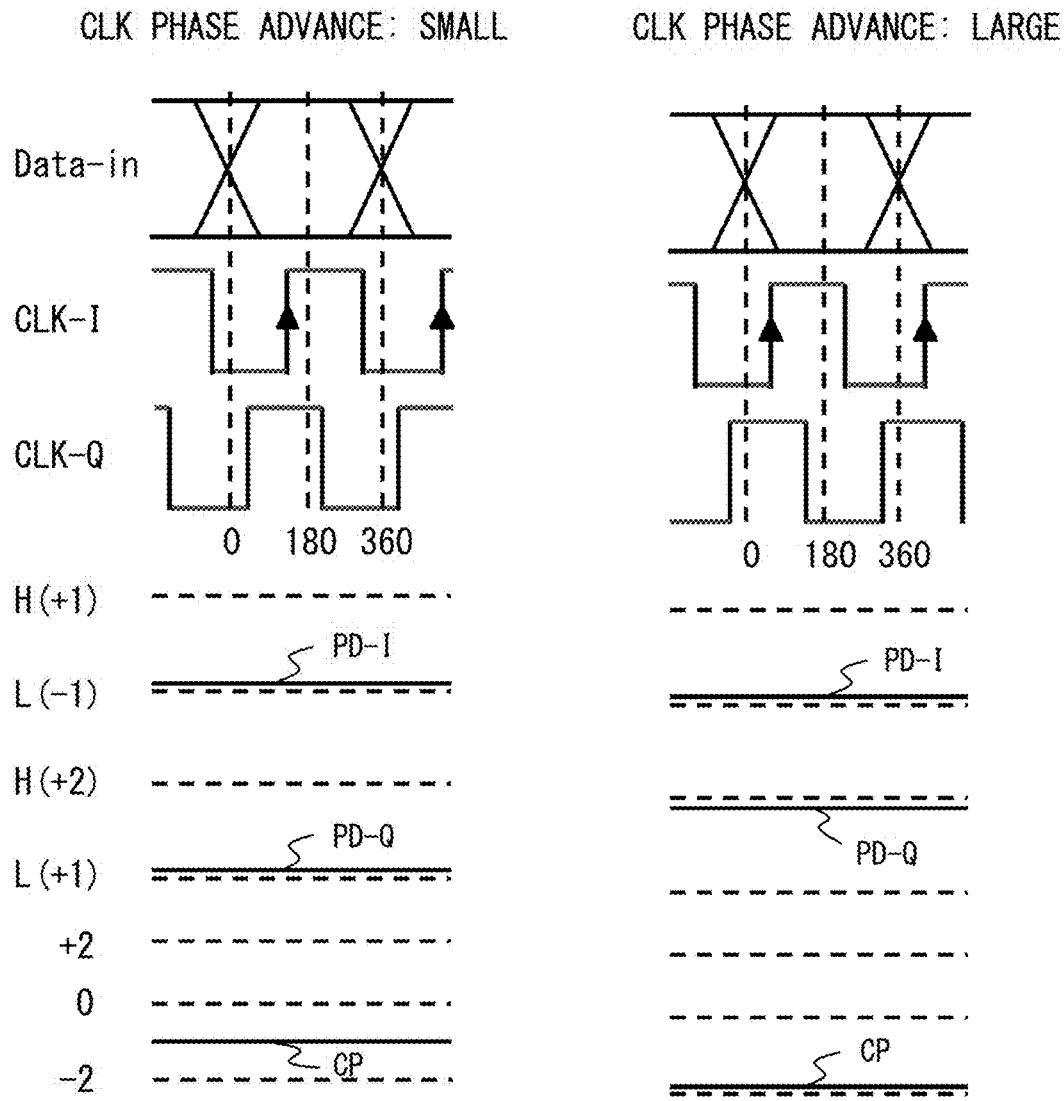
F I G. 5A    F I G. 5B

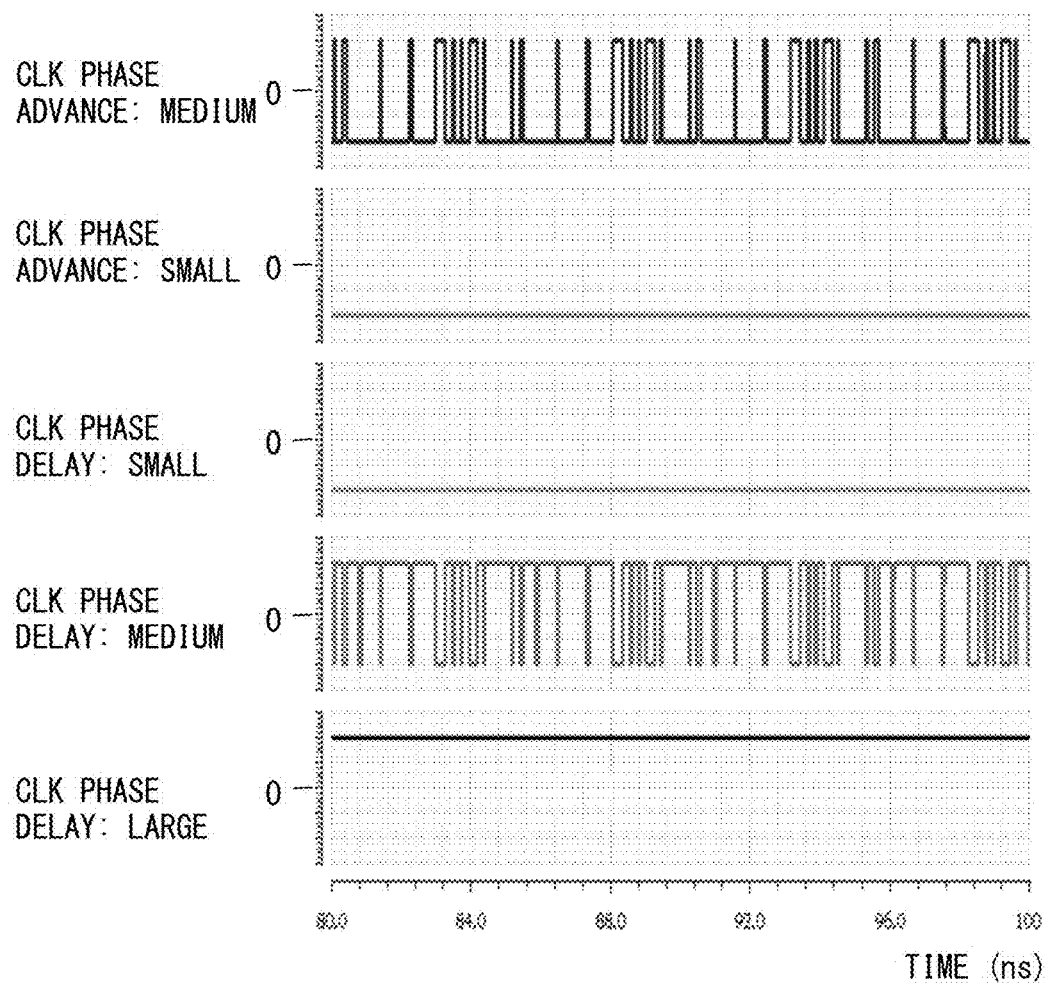
F I G. 1 1

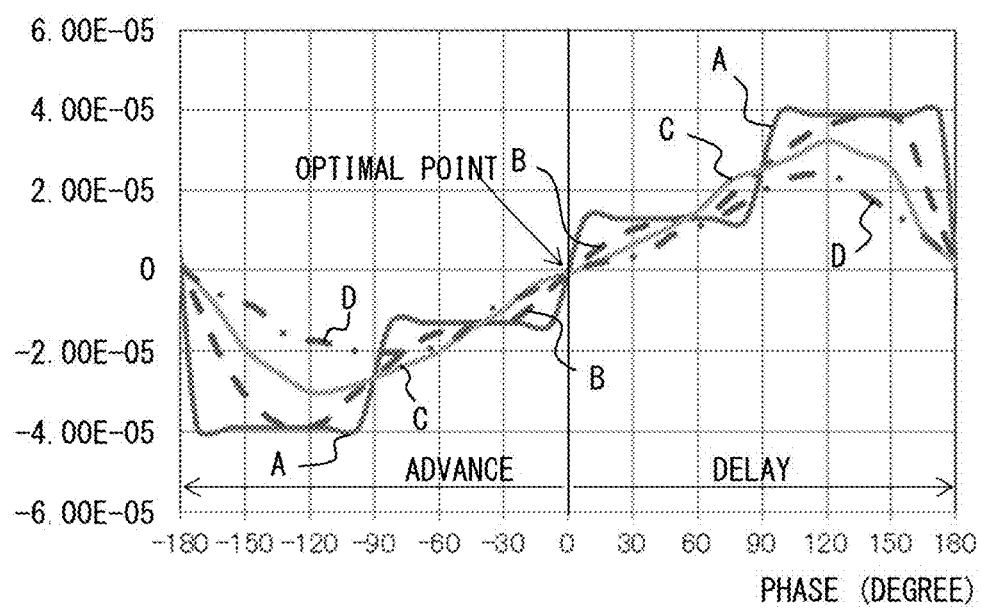
F I G. 1 2

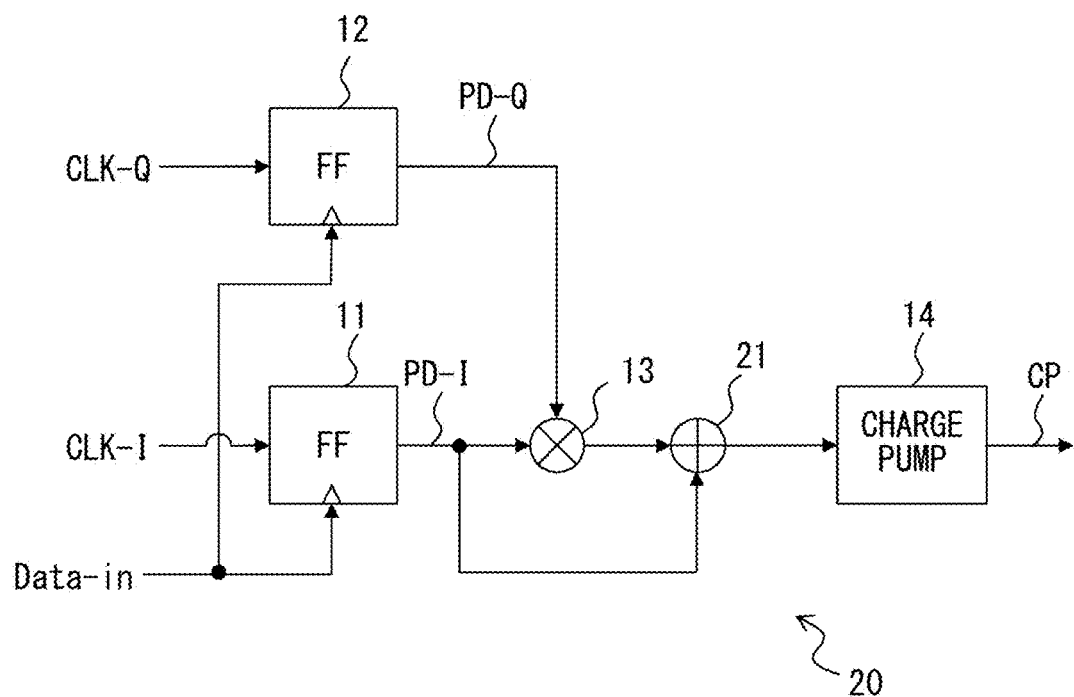
F I G. 1 3

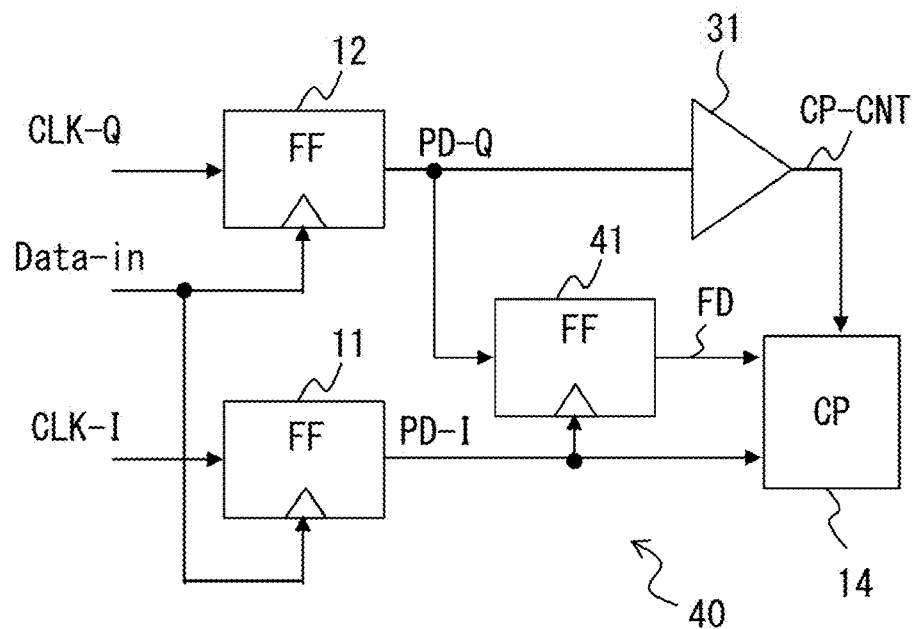
F I G. 1 5

PHASE DETECTION CIRCUIT AND SIGNAL RECOVERY CIRCUIT THAT INCLUDES PHASE DETECTION CIRCUIT

CROSS-REFERENCE TO RELATED APPLICATION

This application is based upon and claims the benefit of priority of the prior Japanese Patent Application No. 2015-140122, filed on Jul. 14, 2015, the entire contents of which are incorporated herein by reference.

FIELD

The embodiments discussed herein are related to a phase detection circuit that detects a phase of a clock signal with respect to a data signal and a signal recovery circuit that includes the phase detection circuit.

BACKGROUND

A receiver circuit that receives a digital signal is required to decide each data bit at an appropriate timing. For this reason, the receiver circuit often includes a signal recovery circuit (CDR: Clock Data Recovery) that recovers a clock and data from a received signal.

FIGS. 1A and 1B illustrate an example of a configuration and an operation of a signal recovery circuit. As illustrated in FIG. 1A, a signal recovery circuit 1 includes a phase detector 2, a charge pump 3, a loop filter 4, and a voltage controlled oscillator (VCO) 5. The phase detector 2 generates a phase detection signal PD indicating whether a clock signal CLK is delayed or advanced with respect to an input data signal "Data". The charge pump 3 outputs current CP corresponding to the phase detection signal PD. The loop filter 4 averages the current CP output from the charge pump 3 so as to generate a control voltage. The VCO 5 generates a clock signal CLK of a frequency corresponding to the control voltage generated by the loop filter 4.

In the signal recovery circuit illustrated in FIG. 1A, when a clock signal is delayed with respect to an input data signal, the phase detector 2 outputs, for example, a phase detection signal of H-level. In this case, the oscillating frequency of the VCO 5 becomes higher, and then the phase of the clock signal with respect to the input data signal becomes closer to an optimal value. On the other hand, when the clock signal is advanced with respect to the input data signal, the phase detector 2 outputs, for example, a phase detection signal of L-level. In this case, the oscillating frequency of the VCO 5 becomes lower, and then the phase of the clock signal with respect to the input data signal becomes closer to the optimal value.

As a result, as illustrated in FIG. 1B, a rising edge of the clock signal is adjusted to be in the center of each bit of the input data signal, and the data signal is recovered by using the adjusted clock signal. At this point, a jitter of the data signal is removed.

As a related technology, a method for performing control such that a receiving-sensitivity control parameter that determines a receiving sensitivity of an optical receiver circuit is automatically located at an optimal position has been proposed (see, for example, Japanese Laid-open Patent Publication No. 2003-258924). An automatic-timing-adjustment decision circuit that realizes a speed up of an operation by reducing a load of a decision circuit has been proposed (see, for example, Japanese Laid-open Patent Publication No. 07-240762). An optical repeater that adjusts an optimal decision phase automatically so as to prevent a degradation of bit error rate characteristics has been proposed (see, for example, Japanese Laid-open Patent Publication No. 07-38505). A phase-locked loop for improving the accuracy of a phase/frequency detection has been proposed (see, for example, U.S. Pat. No. 5,694,088).

However, in the signal recovery circuit 1 of FIG. 1A, the phase of a clock signal is adjusted only according to a phase detection signal that indicates whether a clock signal is delayed or advanced with respect to an input data signal. Thus, it may take long time to optimize the phase of a clock signal. For example, even when a clock signal is greatly delayed or slightly delayed, the same phase detection signal is generated, so the amount of change in the oscillating frequency of the VCO 5 is the same. Thus, when the clock signal is greatly delayed, it takes long time to optimize the phase of the clock signal. On the other hand, when the clock signal is slightly delayed, the phase of the clock signal may go beyond an optimal point in the process of adjusting the phase of the clock signal.

SUMMARY

According to an aspect of the embodiments, a phase detection circuit includes: a first circuit configured to generate a first phase detection signal that indicates a result of sampling a first clock signal at a transition timing of an input data signal; a second circuit configured to generate a second phase detection signal that indicates a result of sampling a second clock signal at the transition timing of the input data signal, a phase of the second clock signal being different from a phase of the first clock signal; and a third circuit configured to generate a third phase detection signal that indicates a phase of the first clock signal with respect to the input data signal based on the first phase detection signal and the second phase detection signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 illustrates an example of a signal recovery circuit according to a first embodiment;

FIG. 3 illustrates an example of an operation of a phase detection circuit when a clock phase is optimized;

FIGS. 4A and 4B illustrate examples of the operation of the phase detection circuit when the clock phase is delayed;

FIGS. 5A and 5B illustrate examples of the operation of the phase detection circuit when the clock phase is advanced;

FIGS. 10 and 11 illustrate results of a simulation regarding a phase detection signal;

FIG. 12 illustrates a charge pump current generated by the phase detection circuit of the first embodiment;

FIG. 13 illustrates an example of a phase detection circuit of a second embodiment;

FIG. 15 illustrates an example of a phase detection circuit of a fourth embodiment;

DESCRIPTION OF EMBODIMENTS

First Embodiment

Figure 1A:
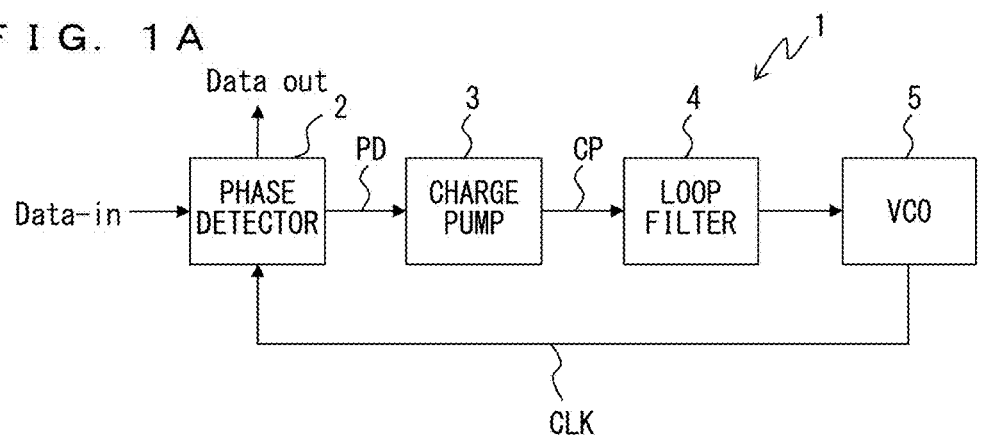
FIGS. 1A and 1B illustrate an example of a configuration and an operation of a signal recovery circuit.
Figure 1B:
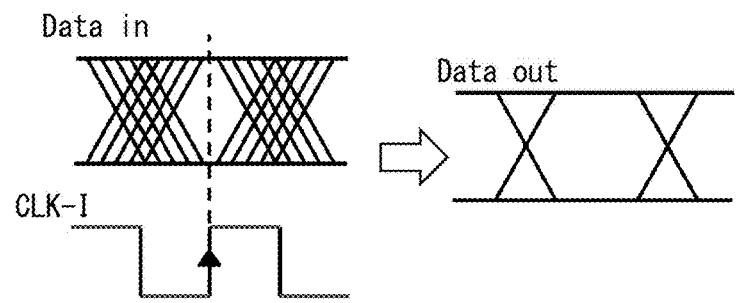

FIG. 2 illustrates an example of a signal recovery circuit according to a first embodiment of the present invention. As illustrated in FIG. 2, a signal recovery circuit 10 of the first embodiment includes a flip-flop 11, a flip-flop 12, a multiplication circuit 13, a charge pump 14, a loop filter 15, a voltage controlled oscillator (VCO) 16, a delay element 17, and a data recovery circuit 18. A data signal "Data-in" is input into the signal recovery circuit 10.

In the following descriptions, a timing at which the state of a signal (including a data signal and a clock signal) transits from L level to H level may be referred to as a "rising edge". Further, a timing at which the state of a signal transits from H level to L level may be referred to as a "falling edge". Furthermore, the rising edge and the falling edge may be collectively referred to as a "transition edge" or a "transition timing".

The flip-flop 11 is a D-type flip-flop, and equipped with a D terminal, a C terminal, and a Q terminal. A clock signal CLK-I that is generated by the VCO 16 is input into the D terminal. A data signal "Data-in" is input into the C terminal. Thus, the flip-flop 11 samples a state (H or L) of the clock signal CLK-I on a rising edge of the data signal "Data-in" and holds the detected state. The flip-flop 11 outputs a signal that indicates the detected state through the Q terminal until a next rising edge is input into the C terminal. In the following descriptions, the output signal of the flip-flop 11 may be referred to as a "phase detection signal PD-I".

The flip-flop 12 is also a D-type flip-flop, and equipped with a D terminal, a C terminal, and a Q terminal. A clock signal CLK-Q is input into the D terminal. The frequencies of the clock signal CLK-I and the clock signal CLK-Q are the same each other. However, the phase of the clock signal CLK-Q is different from that of the clock signal CLK-I. For example, the phase difference between the clock signal CLK-I and the clock signal CLK-Q is 90 degrees. A data signal "Data-in" is input into the C terminal. Thus, the flip-flop 12 samples a state (H or L) of the clock signal CLK-Q on a rising edge of the data signal "Data-in" and holds the detected state. The flip-flop 12 outputs a signal that indicates the detected state through the Q terminal until a next rising edge is input into the C terminal. In the following descriptions, the output signal of the flip-flop 12 may be referred to as a "phase detection signal PD-Q".

The multiplication circuit 13 multiplies the phase detection signal PD-I output from the flip-flop 11 by the phase detection signal PD-Q output from the flip-flop 12. The charge pump 14 generates a charge pump current CP that corresponds to an output signal of the multiplication circuit 13. In other words, the charge pump current CP is dependent on a result of multiplying the phase detection signal PD-I by the phase detection signal PD-Q. The loop filter 15 averages the charge pump current CP output from the charge pump 14 so as to generate a control voltage. The VCO 16 generates a clock signal CLK-I of a frequency corresponding to the control voltage generated by the loop filter 15.

The delay element 17 delays the clock signal CLK-I generated by the VCO 16 so as to generate the clock signal CLK-Q. A delay time in the delay element 17 corresponds to the phase difference between the clock signal CLK-I and the clock signal CLK-Q. For example, the delay time in the delay element 17 is one-quarter of one period of the clock signal CLK-I. In the example of FIG. 2, the clock signal CLK-Q is generated by delaying the clock signal CLK-I, but the present invention is not limited to this configuration. In other words, it is sufficient if a polarity of the PD-Q signal is adjusted at the end even when the phase of the clock signal CLK-Q is advanced or delayed with respect to the phase of the clock signal CLK-I.

The data recovery circuit 18 decides the data signal "Data-in" using the clock signal CLK-I so as to recover data. The data recovery circuit 18 is realized by, for example, a D-type flip-flop.

A phase detection circuit 19 is configured to include the flip-flop 11, the flip-flop 12, the multiplication circuit 13 and the charge pump 14, and detect the phase of a clock signal CLK-I with respect to a data signal. Note that the phase detection circuit 19 does not have to include the charge pump 14. In addition, the phase detection circuit 19 may include the loop filter 15.

FIGS. 3, 4A-4B and 5A-5B illustrate examples of operations of the phase detection circuit 19. The data signals "Data-in" are respectively input into the C terminals of the flip-flops 11 and 12. The clock signal CLK-I is input into the D terminal of the flip-flop 11. The clock signal CLK-Q is input into the D terminal of the flip-flop 12. The phase detection signal PD-I is output from the Q terminal of the flip-flop 11. The phase detection signal PD-Q is output from the Q terminal of the flip-flop 12. The charge pump current CP is output from the charge pump 14. Note that it is assumed that "CP" illustrated in FIGS. 3, 4A-4B and 5A-5B are equivalent to the output signal of the multiplication circuit 13.

In FIG. 3, the phase of the clock signal CLK-I is optimized with respect to the data signal "Data-in". In other words, the rising edge of the clock signal CLK-I is adjusted to be in the center of each bit of the data signal "Data-in". In the following descriptions, a period of time for one bit of the data signal "Data-in" may be represented by "$2\pi$". In this case, the center of each bit of the data signal "Data-in" is represented by "$\pi$ (180 degrees)."

In FIGS. 4A and 4B, the clock signal CLK-I is delayed with respect to the data signal "Data-in". Specifically, in FIG. 4A, the delay of the clock signal CLK-I with respect to the data signal "Data-in" is large. In FIG. 4B, the delay of the clock signal CLK-I with respect to the data signal "Data-in" is small.

The state of the phase detection signal PD-I output from the flip-flop 11 is H level or L level. However, it is assumed that H level of the phase detection signal PD-I indicates "+1", and L level of the phase detection signal PD-I indicates "−1". The state of the phase detection signal PD-Q output from the flip-flop 12 is also H level or L level. However, it is assumed that H level of the phase detection signal PD-Q indicates "+2", and L level of the phase detection signal PD-Q indicates "+1".

The flip-flop 11 samples a state of the clock signal CLK-I on a rising edge of the data signal "Data-in", and outputs a phase detection signal PD-I that indicates the detected state. Thus, as illustrated in FIGS. 4A and 4B, when the clock signal CLK-I is delayed, the state of the phase detection signal PD-I is "H(+1)", regardless of whether the delay of the clock signal CLK-I is large or small.

The flip-flop 12 samples a state of the clock signal CLK-Q on a rising edge of the data signal "Data-in", and outputs a phase detection signal PD-Q that indicates the detected state. In this case, when the clock signal CLK-I is delayed, the state of the phase detection signal PD-Q is dependent on the amount of delay of the clock signal CLK-I with respect to the data signal "Data-in". In other words, when the delay of the clock signal CLK-I is larger than a specified threshold, the state of the detection signal PD-Q is "H(+2)", as illustrated in FIG. 4A. On the other hand, when the delay of the clock signal CLK-I is smaller than the threshold, the state of the detection signal PD-Q is "L(+1)", as illustrated in FIG. 4B. The threshold corresponds to the phase difference between the clock signal CLK-I and the clock signal CLK-Q. In this example, the phase difference between the clock signal CLK-I and the clock signal CLK-Q is 90 degrees.

The charge pump current CP indicates a result of multiplying the phase detection signal PD-I by the phase detection signal PD-Q. In other words, the charge pump current CP is represented by the following formula:

$$CP = PD\text{-}I \times PD\text{-}Q$$

Thus, when the delay of the clock signal CLK-I is larger than the threshold, the charge pump current CP is "+2", as illustrated in FIG. 4A. On the other hand, when the delay of the clock signal CLK-I is smaller than the threshold, the charge pump current CP is "+1", as illustrated in FIG. 4B.

In FIGS. 5A and 5B, the clock signal CLK-I is advanced with respect to the data signal "Data-in". Specifically, in FIG. 5A, the advance of clock signal CLK-I with respect to the data signal "Data-in" is small. In FIG. 5B, the advance of the clock signal CLK-I with respect to the data signal "Data-in" is large.

The flip-flop 11 samples a state of the clock signal CLK-I on arising edge of the data signal "Data-in", and outputs a phase detection signal PD-I that indicates the detected state. Thus, as illustrated in FIGS. 5A and 5B, when the clock signal CLK-I is advanced, the state of the phase detection signal PD-I is "L(−1)", regardless of whether the advance of the clock signal CLK-I is large or small.

The flip-flop 12 samples a state of the clock signal CLK-Q on arising edge of the data signal "Data-in", and outputs a phase detection signal PD-Q that indicates the detected state. In this case, when the clock signal CLK-I is advanced, the state of the phase detection signal PD-Q is dependent on the amount of advance of the clock signal CLK-I with respect to the data signal "Data-in". In other words, when the advance of the clock signal CLK-I is larger than the threshold, the state of the detection signal PD-Q is "H(+2)", as illustrated in FIG. 5B. On the other hand, when the advance of the clock signal CLK-I is smaller than the threshold, the state of the detection signal PD-Q is "L(+1)", as illustrated in FIG. 5A.

As described above, the charge pump current CP indicates a result of multiplying the phase detection signal PD-I by the phase detection signal PD-Q. Thus, when the advance of the clock signal CLK-I is larger than the threshold, the charge pump current CP is "−2", as illustrated in FIG. 5B. On the other hand, when the advance of the clock signal CLK-I is smaller than the threshold, the charge pump current CP is "−1", as illustrated in FIG. 5A.

As described above, the phase detection signal PD-I generated by the flip-flop 11 indicates whether the clock signal CLK-I is delayed or advanced with respect to the data signal "Data-in". In this example, when the clock signal CLK-I is delayed, the phase detection signal PD-I is "H(+1)", as illustrated FIGS. 4A and 4B. On the other hand, when the clock signal CLK-I is advanced, the phase detection signal PD-I is "L(−1)", as illustrated in FIGS. 5A and 5B.

The phase detection signal PD-Q generated by the flip-flop 12 indicates the amount of phase shift of the clock signal CLK-I with respect to the data signal "Data-in". In this example, when the amount of phase shift of the clock signal CLK-I is larger than the threshold, the phase detection signal PD-Q is "H(+2)", as illustrated in FIG. 4A and FIG. 5B. On the other hand, when the amount of phase shift of the clock signal CLK-I is smaller than the threshold, the phase detection signal PD-Q is "L(+1)", as illustrated in FIG. 4B and FIG. 5A.

Thus, the charge pump current CP generated according to a result of multiplying the phase detection signal PD-I by the phase detection signal PD-Q indicates not only whether the phase of the clock signal CLK-I is delayed or advanced with respect to the data signal "Data-in", but also the amount of phase shift of the clock signal CLK-I.

When the phase of the clock signal CLK-I is optimized with respect to the data signal "Data-in", the transition timing of the data signal "Data-in" is substantially the same as the transition timing of the clock signal CLK-I, as illustrated in FIG. 3. Thus, when the state of the clock signal CLK-I is sampled in the flip-flop 11 on a rising edge of the data signal "Data-in", the probability of obtaining "H(+1)" is substantially the same as the probability of obtaining "L(−1)". Therefore, in FIG. 3, the phase detection signal PD-I is "zero" for convenience. As a result, the charge pump current CP generated according to the result of multiplying the phase detection signal PD-I by the phase detection signal PD-Q is also "zero".

Figure 6A:
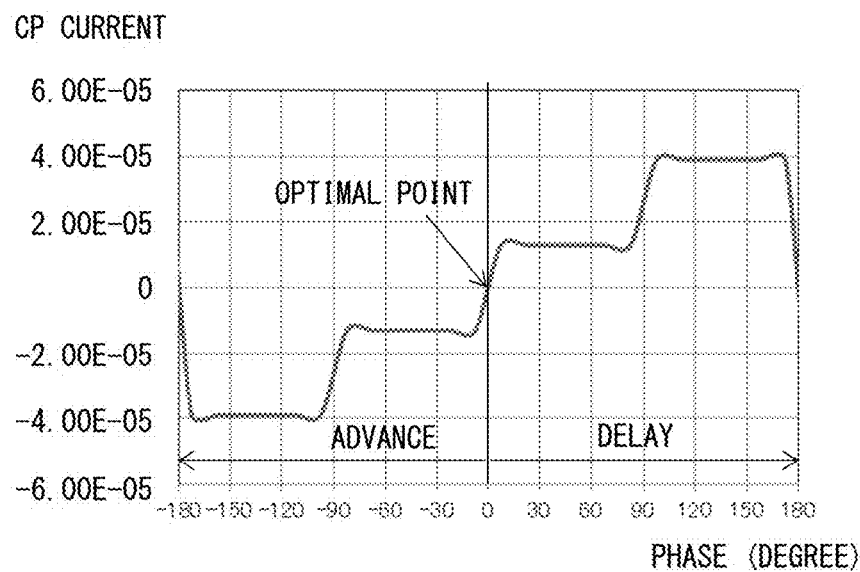
FIGS. 6A and 6B illustrate examples of a charge pump current with respect to a clock phase.
Figure 6B:
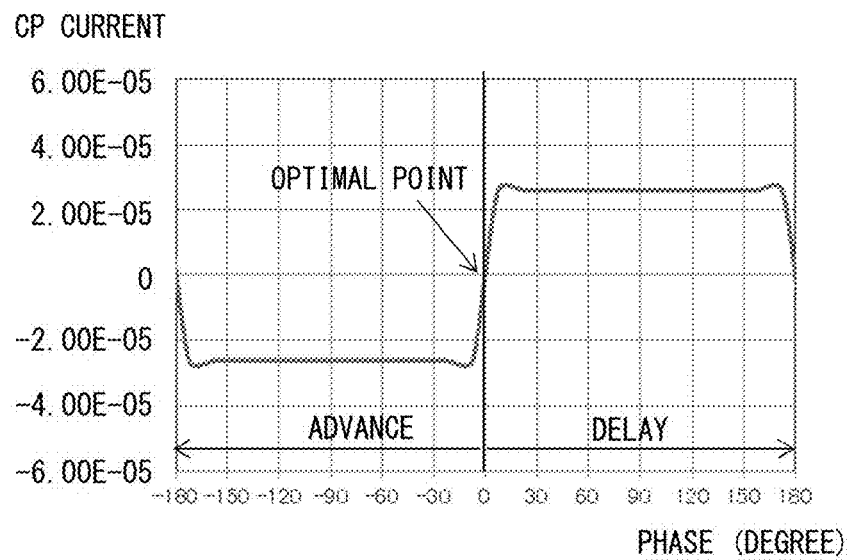

FIGS. 6A and 6B illustrate examples of a charge pump current with respect to a clock phase. FIG. 6A illustrates a charge pump current generated in the phase detection circuit 19 according to the first embodiment of FIG. 2. In this example, the phase difference between the clock signal CLK-I and the clock signal CLK-Q is 90 degrees. FIG. 6B illustrates a charge pump current generated in the signal recovery circuit of FIG. 1A.

In this example, when the phase of the clock signal CLK-I is delayed with respect to the data signal "Data-in", a positive charge pump current CP is generated, as illustrated in FIG. 6A. When the clock signal CLK-I is advanced with respect to the data signal "Data-in", a negative charge pump current CP is generated.

The charge pump current CP controls an oscillating frequency of the VCO 16 illustrated in FIG. 2. Here, for example, it is assumed that the VCO 16 is controlled such that the oscillating frequency is higher when the positive charge pump current CP is generated and that the VCO 16 is controlled such that the oscillating frequency is lower when the negative charge pump current CP is generated. In this case, when the clock signal CLK-I is delayed, the VCO 16 is controlled such that the oscillating frequency is higher because the positive charge pump current CP is generated. As a result, the phase of the clock signal CLK-I is closer to an optimal point. On the other hand, when the clock signal CLK-I is advanced, the VCO 16 is controlled such that the oscillating frequency is lower because the negative charge pump current CP is generated. As a result, the phase of the clock signal CLK-I is closer to the optimal point.

The amount of the charge pump current CP (that is, the absolute value of the charge pump current CP) is dependent on the phase of the clock signal CLK-I, as illustrated in FIG. 6A. Specifically, when the delay of the phase of the clock signal CLK-I is smaller than 90 degrees, the charge pump current CP is about +15 µA, and when the delay of the phase of the clock signal CLK-I is larger than 90 degrees, the charge pump current CP is about +40 µA. Likewise, when the advance of the phase of the clock signal CLK-I is smaller than 90 degrees, the charge pump current CP is about −15 µA, and when the advance of the phase of the clock signal CLK-I is larger than 90 degrees, the charge pump current CP is about −40 µA.

For example, it is assumed that when the charge pump current CP increases by 1 µA for a period of time t, the control voltage of the VCO 16 that is controlled by the charge pump varies and the oscillating frequency of the VCO 16 increases by 10 kHz. In this case, in FIG. 6A, when the delay of the phase of the clock signal CLK-I is smaller than 90 degrees, the charge pump current CP is controlled to increase by 15 µA for the period of time t, and thus the VCO 16 is controlled such that the oscillating frequency increases by about 150 kHz. Further, when the delay of the phase of the clock signal CLK-I is larger than 90 degrees, the charge pump current CP is controlled to increase by 40 µA for the period of time t, and thus the VCO 16 is controlled such that the oscillating frequency increases by about 400 kHz. Likewise, when the advance of the phase of the clock signal CLK-I is smaller than 90 degrees, the VCO 16 is controlled such that the oscillating frequency increases by about 150 kHz. Further, when the advance of the clock signal CLK-I is larger than 90 degrees, the VCO 16 is controlled such that the oscillating frequency increases by about 400 kHz. In the example described above, it is assumed that the charge pump current is constant for the period of time t, but actually, the control voltage of the VCO is controlled according to an accumulated amount of charge pump current, so the oscillating frequency of the VCO is controlled by the accumulated amount of charge pump current.

As described above, when the phase shift of the clock signal CLK-I is small (smaller than the threshold), the amount of change in the oscillating frequency of the VCO 16 is small. Thus, when the oscillating frequency of the VCO 16 is controlled according to the charge pump current CP, an over-adjustment in which the state of the phase of the clock signal CLK-I is transited from a delayed state to an advanced state beyond the optimal point (or an over-adjustment in which the state of the phase of the clock signal CLK-I is transited from an advanced state to a delayed state beyond the optimal point) is prevented. As a result, in the control system of the signal recovery circuit illustrated in FIG. 2, an accurate adjustment can be performed such that the phase of the clock signal CLK-I is at the optimal point.

Further, when the phase shift of the clock signal CLK-I is large (larger than the threshold), the amount of change in the oscillating frequency of the VCO 16 is large. Thus, when the oscillating frequency of the VCO 16 is controlled according to the charge pump current CP, the phase of the clock signal CLK-I becomes close to the optimal point in a short time.

On the other hand, in the signal recovery circuit illustrated in FIG. 1A, a phase detection signal only indicates whether a clock signal is delayed or advanced with respect to a data signal. In other words, a charge pump current only indicates whether the clock signal is delayed or advanced with respect to the data signal. In the example of FIG. 6B, when the phase of a clock signal is delayed, a charge pump current of about +25 µA is generated regardless of the amount of delay. When the phase of the clock signal is advanced, a charge pump current of about −25 µA is generated regardless of the amount of advance. Thus, in the signal recovery circuit of FIG. 1A, it is difficult to perform control such that the phase of a clock signal becomes close to an optimal point.

For example, if a circuit parameter is determined such that the adjustment accuracy of a VCO is high for a small phase shift, the adjustment time is long when the phase shift is large. On the other hand, if the circuit parameter is determined such that the adjustment time of the VCO is short for a large phase shift, the adjustment accuracy is low when the phase shift is small.

As described above, according to the first embodiment, a direction of a phase shift and the amount of phase shift of a clock signal are detected using a simple configuration (the flip-flops 11 and 12, the multiplication circuit 13, and the charge pump 14). In other words, in a signal recovery circuit that recovers an input data signal using a clock signal, a clock phase can be adjusted in a short time and/or accurately.

A jitter may be added to an input data signal. Further, there is a possibility that the phase detection circuit will not be able to accurately detect the phase of a clock signal with respect to the input data signal when the jitter of the input data signal is large.

For example, in the signal recovery circuit of FIG. 1A, a phase detection signal only indicates whether a clock signal is delayed or advanced. In such a configuration, if a jitter of the input data signal is large, a phase detection signal indicating that the phase of a clock signal is advanced may be generated when the phase of the clock signal is actually delayed. Likewise, a phase detection signal indicating that the phase of a clock signal is delayed may be generated when the phase of the clock signal is actually advanced. In these cases, the oscillating frequency of the VCO is controlled erroneously, and thus the input data signal may not be recovered correctly.

Figure 7:
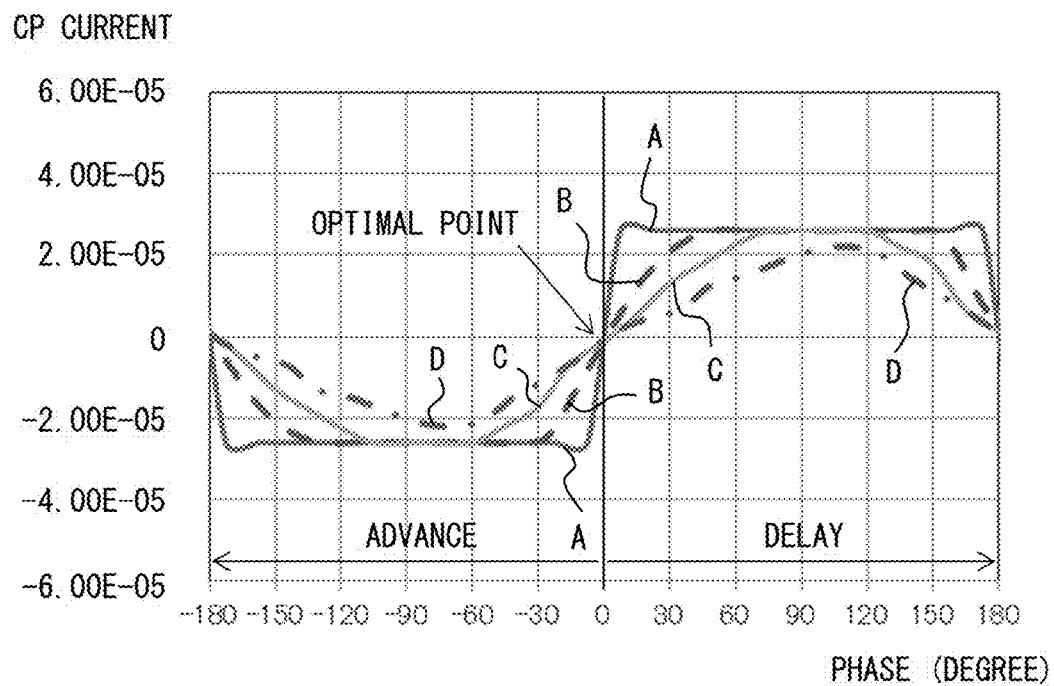
FIG. 7 illustrates a charge pump current generated in the signal recovery circuit of FIG. 1A.

FIG. 7 illustrates an example of a charge pump current generated in the signal recovery circuit of FIG. 1A. The features A, B, C, and D indicate charge pump currents with respect to clock phases when jitters are 0.06 UI, 0.18 UI, 0.34 UI, and 0.56 UI, respectively. Here, 0.01 UI is equivalent to 1 percent of a period of time for one bit of a data signal.

In the signal recovery circuit of FIG. 1A, a charge pump current is strongly dependent on the amount of jitter. Thus, it is difficult to optimize the phase of a clock with respect to a data signal. For example, as represented by the feature A in FIG. 7, when the jitter is small, a large charge pump current is generated even if the phase of a clock signal is slightly shifted from an optimal point. Thus, the amount of change in the oscillating frequency of the VCO is too large, with the result that it is difficult to optimize the clock phase. On the other hand, as represented by the feature D in FIG. 7, when the jitter is large, there is a possibility that a sufficient charge pump current will not be generated even if the phase of a clock is largely shifted from the optimal point. Thus, the amount of charge in the oscillating frequency of the VCO is small, with the result that it takes long time to optimize the clock phase.

According to the first embodiment, an effect of a jitter is suppressed when a charge pump current is generated. The suppression of an effect of a jitter is described below.

Figure 8:
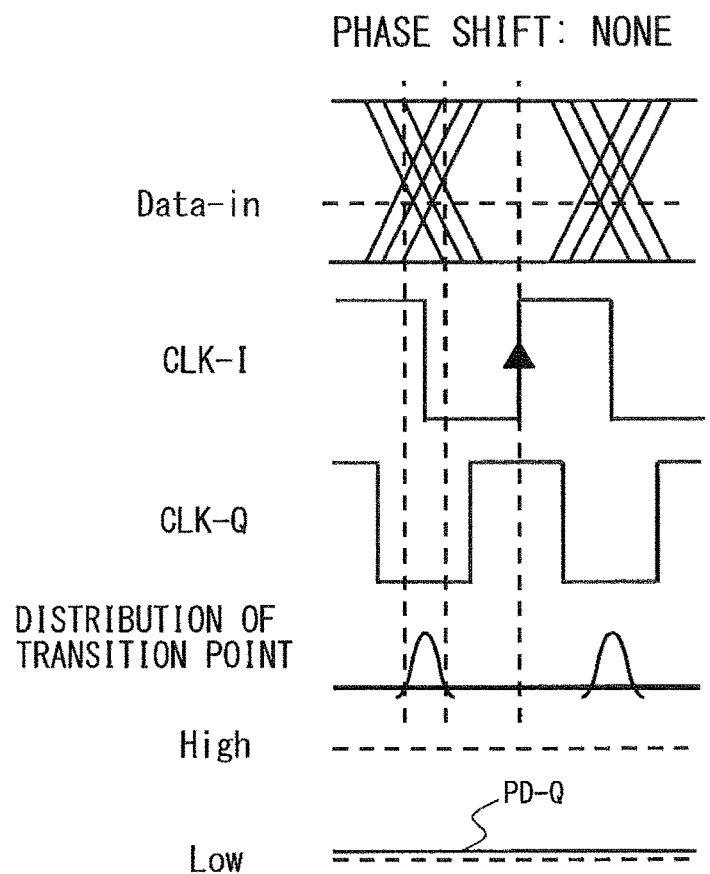
FIG. 8 and FIGS. 9A-9C illustrate examples of a phase detection signal obtained by use of a data signal to which a jitter is added.
Figure 9:
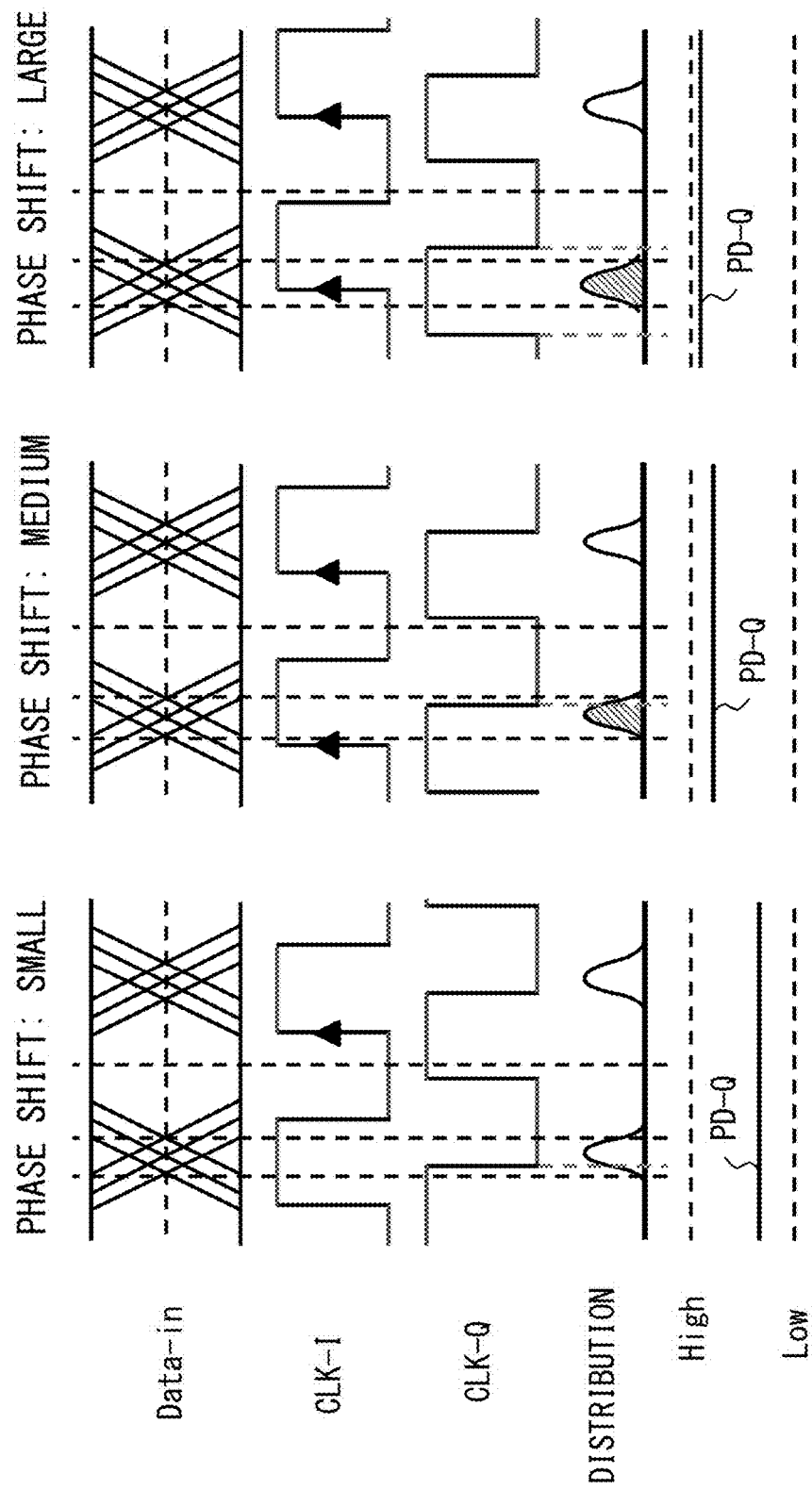

FIG. 8 and FIGS. 9A-9C illustrate examples of a phase detection signal obtained by use of a data signal to which a jitter is added. FIG. 8 illustrates a phase detection signal PD-Q generated by the flip-flop 12 when a clock phase is optimized. FIGS. 9A, 9B, and 9C illustrate phase detection signals PD-Q generated by the flip-flop 12 when the shifts of the clock phase is small, large, and very large, respectively.

In each of FIG. 8 and FIGS. 9A-9C, a transition point distribution represents a distribution of a timing at which a transition edge of a data signal "Data-in" appears. In other words, the transition point distribution represents a distribution of a timing at which a clock signal is sampled in the flip-flops 11 and 12. The transition point distribution is narrower when the jitter is small, and the transition point distribution is wider when the jitter is large. However, the position of a peak of the transition point distribution is substantially not dependent on the amount of jitter.

When the clock phase is optimized, the transition point distribution is located within a period of time for which the state of a clock signal CLK-Q is L level, as illustrated in FIG. 8. Thus, the phase detection signal PD-Q generated by the flip-flop 12 is always "L".

When the shift of the clock phase is small, a majority of the transition point distribution is located within the period of time for which the state of the clock signal CLK-Q is L level, and a portion of the transition point distribution is located within a period of time for which the state of the clock signal CLK-Q is H level, as illustrated in FIG. 9A. Thus, an average value of the phase detection signal PD-Q is higher than that in the case illustrated in FIG. 8.

When the shift of the clock phase is large, a majority of the transition point distribution is located within the period of time for which the state of the clock signal CLK-Q is H level, and a portion of the transition point distribution is located within the period of time for which the state of the clock signal CLK-Q is L level, as illustrated in FIG. 9B. Thus, the average value of the phase detection signal PD-Q is higher than those in the cases illustrated in FIG. 8 and FIG. 9A.

When the shift of the clock phase is very large, the transition point distribution is located within the period of time for which the state of the clock signal CLK-Q is H level, as illustrated in FIG. 9C. Thus, the phase detection signal PD-Q generated by the flip-flop 12 is always "H". In other words, the average value of the phase detection signal PD-Q is higher than those in the cases illustrated in FIG. 8, FIG. 9A, and FIG. 9B.

As described above, even when a jitter is added to a data signal "Data-in", an average value of a phase detection signal PD-Q represents the amount of phase shift of a clock signal CLK-I with respect to the data signal "Data-in". Note that the position of a peak of the transition point distribution is substantially not dependent on the amount of jitter. Thus, the average value of the phase detection signal PD-Q represents the amount of phase shift of the clock signal CLK-I, regardless of the jitter added to the data signal "Data-in".

Figure 10:
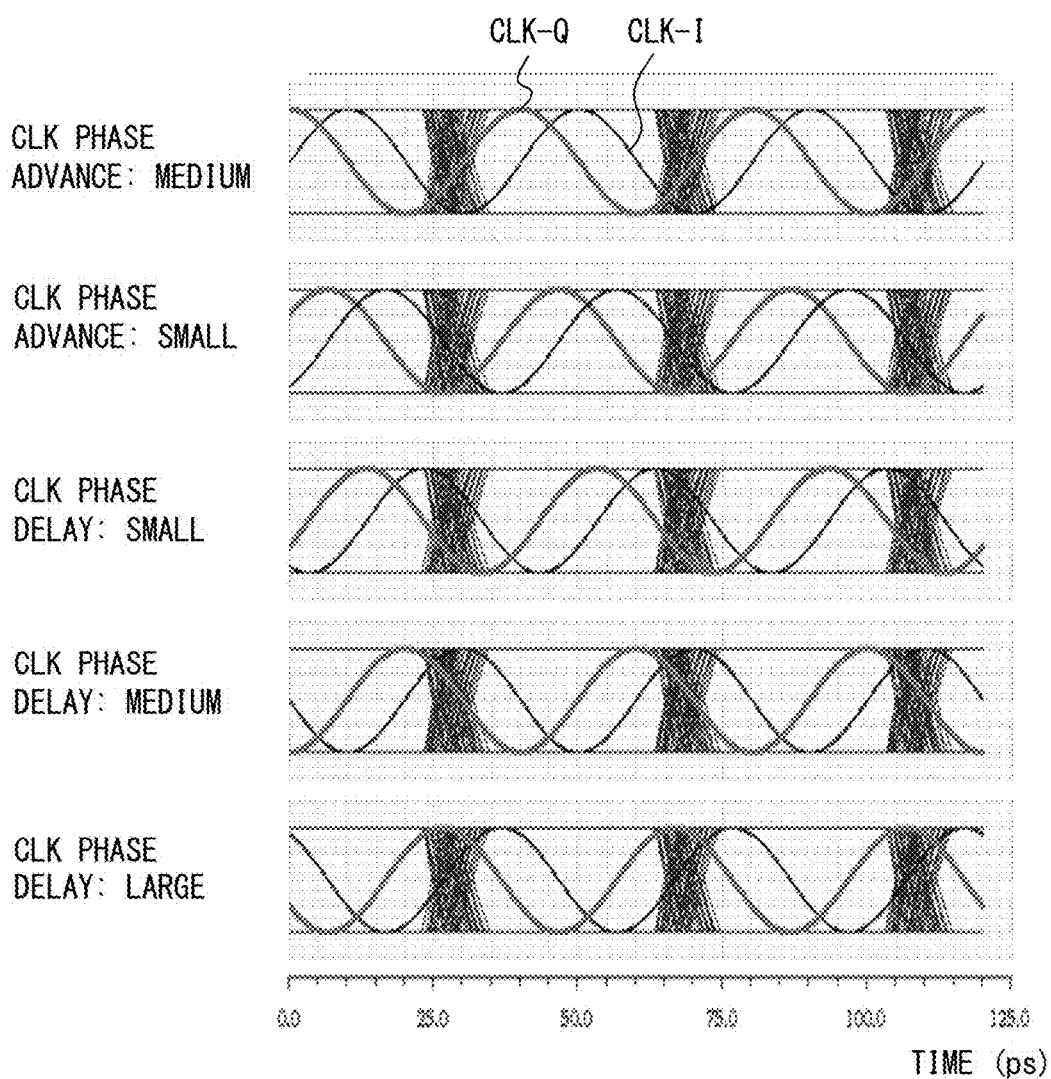

FIGS. 10 and 11 illustrate results of a simulation regarding a phase detection signal obtained by use of a data signal to which a jitter is added. As illustrated in FIGS. 10 and 11, when the shift of a clock phase is small, the state of the clock signal CLK-Q is substantially L level. When the shift of a clock phase is large, the clock signal CLK-Q is in a state in which both L level and H level exist. When the shift of a clock phase is very large, the state of the clock signal CLK-Q is substantially H level.

FIG. 12 illustrates a charge pump current generated by the phase detection circuit 19 of the first embodiment illustrated in FIG. 2. As is the case with the example of FIG. 7, the features A, B, C, and D in FIG. 12 indicate charge pump currents with respect to clock phases when jitters are 0.06 UI, 0.18 UI, 0.34 UI, and 0.56 UI, respectively.

As illustrated in FIG. 12, according to the first embodiment, a relationship between a phase shift of a clock signal and a charge pump current CP is not greatly affected by the amount of jitter. Specifically, in a range in which a clock phase is between 90 degrees and 270 degrees (that is, in a range of ±90 degrees with respect to the optimal point), the charge pump current CP is substantially proportional to the amount of phase shift without being affected by the amount of jitter. In other words, according to the first embodiment, an effect of a jitter is suppressed in the relationship between a phase shift of a clock signal and a charge pump current CP. Thus, even when a jitter is added to an input data signal, the phase of a clock signal that samples the data signal is appropriately adjusted, which results in an accurate recovery of the data signal.

Second Embodiment

FIG. 13 illustrates an example of a phase detection circuit of a second embodiment. A phase detection circuit 20 of the second embodiment includes the flip-flops 11 and 12, the multiplication circuit 13, the charge pump 14, and an addition circuit 21. The flip-flops 11 and 12, the multiplication circuit 13, the charge pump 14 are substantially the same in the first and second embodiments.

The addition circuit 21 adds a phase detection signal PD-I to an output signal of the multiplication circuit 13. In other words, an output signal of the addition circuit 21 is "(PD-I)+(PD-I)×(PD-Q)". Then, the charge pump 14 generates a charge pump current CP corresponding to the output signal of the addition circuit 21.

In the phase detection circuit 20 of the second embodiment, a gain does not become zero when the phase of a clock signal CLK-I is controlled to be around the optimal point with respect to a data signal "Data-in". In other words, in the first embodiment, as illustrated in FIG. 6A, the charge pump current CP has a value close to zero when the phase of the clock signal CLK-I is controlled to be around the optimal point. In this case, a control system of a clock phase may become unstable. On the other hand, in the second embodiment, the control system of a clock phase is less likely to become unstable.

Third Embodiment

In the first embodiment, an output signal of the multiplication circuit 13 is fed to the charge pump 14. In the second embodiment, an output signal of the addition circuit 21 is fed to the charge pump 14. On the other hand, in a third embodiment, functions of the multiplication circuit 13 and/or the addition circuit 21 are realized in a charge pump.

Figure 14A:
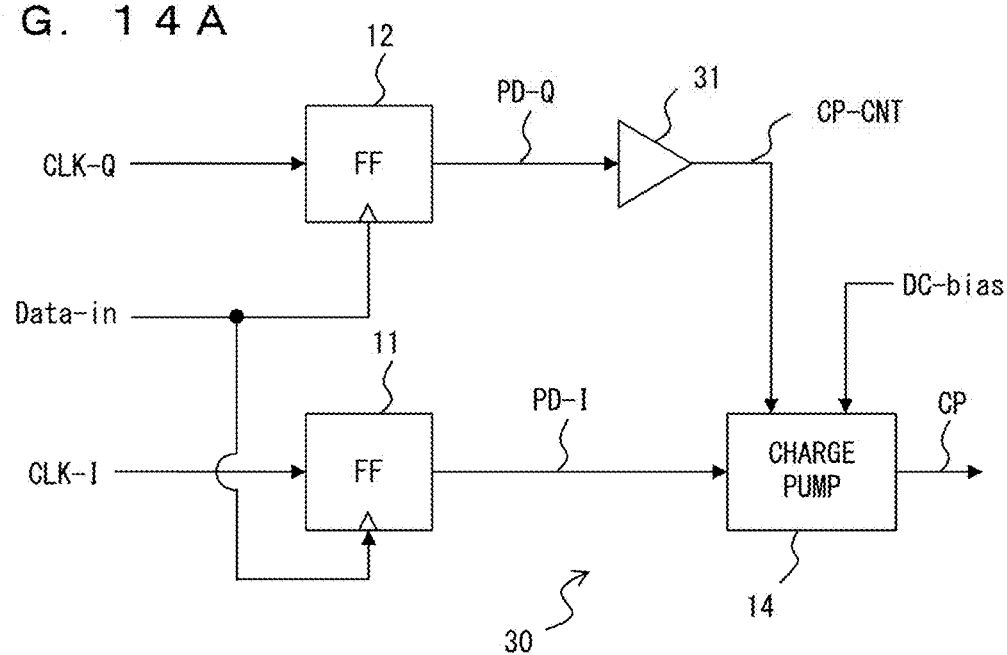
FIGS. 14A and 14B illustrate an example of a phase detection circuit of a third embodiment.
Figure 14B:
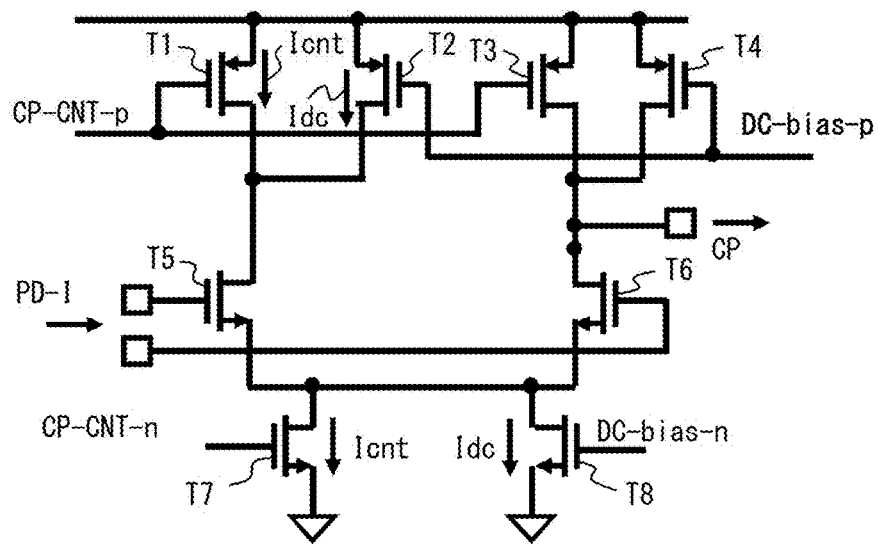

FIGS. 14A and 14B illustrate an example of a phase detection circuit of the third embodiment. As illustrated in FIG. 14A, a phase detection circuit 30 of the third embodiment includes the flip-flops 11 and 12, the charge pump 14, and a buffer circuit 31. The buffer circuit 31 amplifies a phase detection signal PD-Q output from the flip-flop 12 with a specified gain, so as to generate a control signal CP-CNT. Then, the charge pump 14 generates a charge pump current CP according to a phase detection signal PD-I output from the flip-flops 11, the control signal CP-CNT output from the buffer circuit 31, and a specified bias voltage DC-bias.

FIG. 14B illustrates an example of the charge pump 14 that is used in the phase detection circuit of the third embodiment. As illustrated in FIG. 14B, the charge pump 14 of the third embodiment includes transistors T1 to T8.

The transistors T1 and T2 are electrically connected to each other in parallel. Further, the transistor T5 is electrically connected to the transistors T1 and T2. Likewise, the transistors T3 and T4 are electrically connected to each other in parallel. Further, the transistor T6 is electrically connected to the transistors T3 and T4. Moreover, the transistor T7 and the transistor T8 are respectively provided between the transistor T5 and a specified constant potential (for example, a ground potential), and between the transistor T6 and the prescribed constant potential.

In the charge pump 14 having the above-described configuration, the control signal CP-CNT generated from the phase detection signal PD-Q is provided to gates of the transistors T1 and T3. The bias voltage DC-bias is provided to gates of the transistors T2 and T4. The phase detection signal PD-I is provided to gates of the transistors T5 and T6. The control signal CP-CNT is provided to a gate of the transistor T7. The bias voltage DC-bias is provided to the gate of the transistor T8.

As described above, when the control signal CP-CNT is provided to the gates of the transistors T1 and T3, current Icnt flows through each of the transistors T1 and T3. Thus, the current Icnt is controlled by the phase detection signal PD-Q. Further, when the phase detection signal PD-I is provided to the gates of the transistors T5 and T6, current that flows through each of the transistors T5 and T6 is controlled by the phase detection signal PD-I. As a result, current that corresponds to "(PD-I)×(PD-Q)" is generated.

Further, current Idc is generated by the bias voltage DC-bias. The current Idc is also controlled by the phase detection signal PD-I. Thus, the following charge pump current is output from the charge pump 14:

Idc×(PD-I)+Icnt×{(PD-I)×(PD-Q)}

An addition ratio between (PD-I) and (PD-I)×(PD-Q) can be controlled by the current Idc and the current Icnt.

Fourth Embodiment

FIG. 15 illustrates an example of a phase detection circuit of a fourth embodiment. A phase detection circuit 40 of the fourth embodiment includes a function to detect a frequency of a clock signal in addition to the function to detect a phase of a clock signal.

The phase detection circuit 40 includes the flip-flops 11 and 12, the charge pump 14, the buffer circuit 31, and a flip-flop 41. A phase detection signal PD-Q generated by the flip-flop 12 is fed to a D terminal of the flip-flop 41. A phase detection signal PD-I generated by the flip-flop 11 is fed to a C terminal of the flip-flop 41. In other words, the flip-flop 41 samples the phase detection signal PD-Q using the phase detection signal PD-I, and outputs a frequency detection signal FD that indicates a frequency of a clock signal. The charge pump 14 includes a circuit that generates a charge pump current corresponding to a phase of a clock signal and a circuit that generates a charge pump current corresponding to a frequency of a clock signal.

As described above, according to the fourth embodiment, a circuit size can be reduced because the flip-flops 11 and 12 are shared for detecting a phase and a frequency of a clock signal. A circuit that detects a frequency of a clock signal is described in, for example, U.S. Pat. No. 5,694,088.

Fifth Embodiment

Figure 16A:
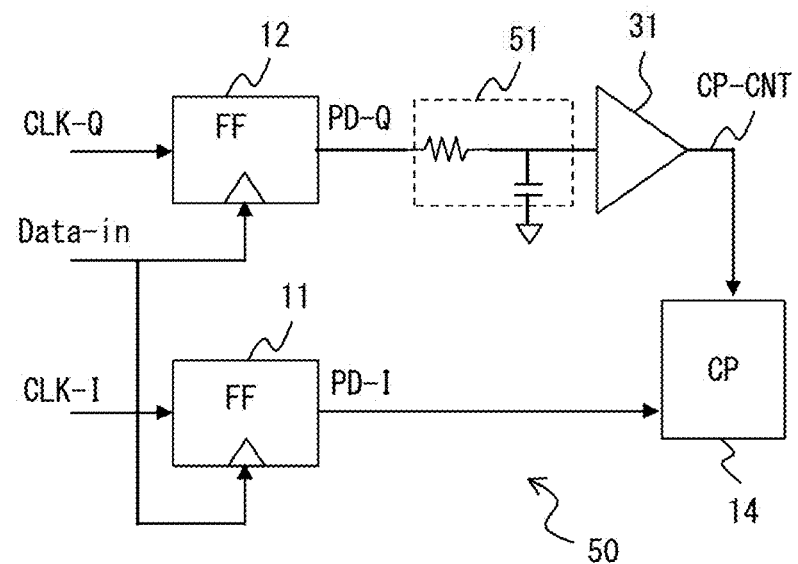
FIGS. 16A and 16B illustrate examples of a phase detection circuit of a fifth embodiment.
Figure 16B:
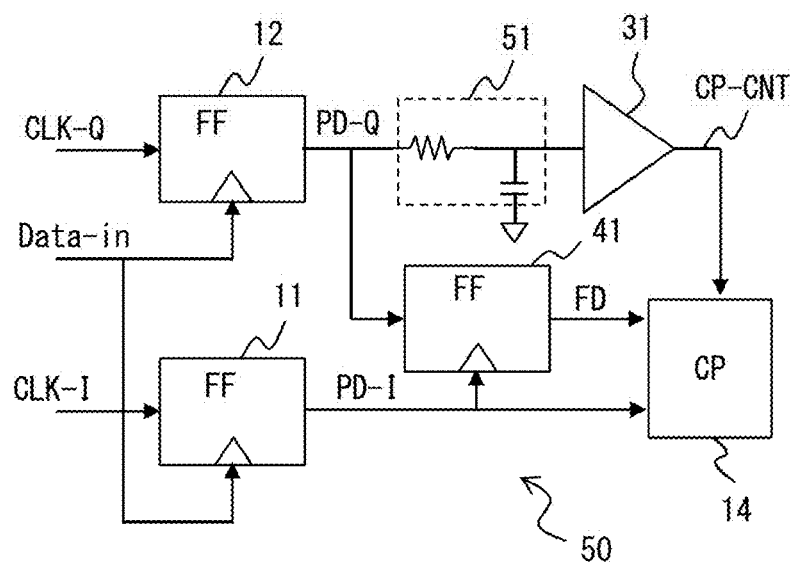

FIGS. 16A and 16B illustrate examples of a phase detection circuit of a fifth embodiment. A phase detection circuit 50 of the fifth embodiment includes a smoothing circuit 51 that smoothes a phase detection signal PD-Q generated by the flip-flop 12. The smoothing circuit 51 is realized by, for example, a low-pass filter that includes a resistor and a capacitor. FIG. 16A illustrates a configuration in which the smoothing circuit 51 is added to the phase detection circuit of the third embodiment. FIG. 16B illustrates a configuration in which the smoothing circuit 51 is added to the phase detection circuit of the fourth embodiment.

Sixth Embodiment

In the first to fifth embodiments, a clock phase with respect to a data signal is detected by use of two clock signals whose phases are different from each other. In a sixth embodiment, a clock phase with respect to a data signal is detected by use of three or more clock signals whose phases are different from one another.

Figure 17:
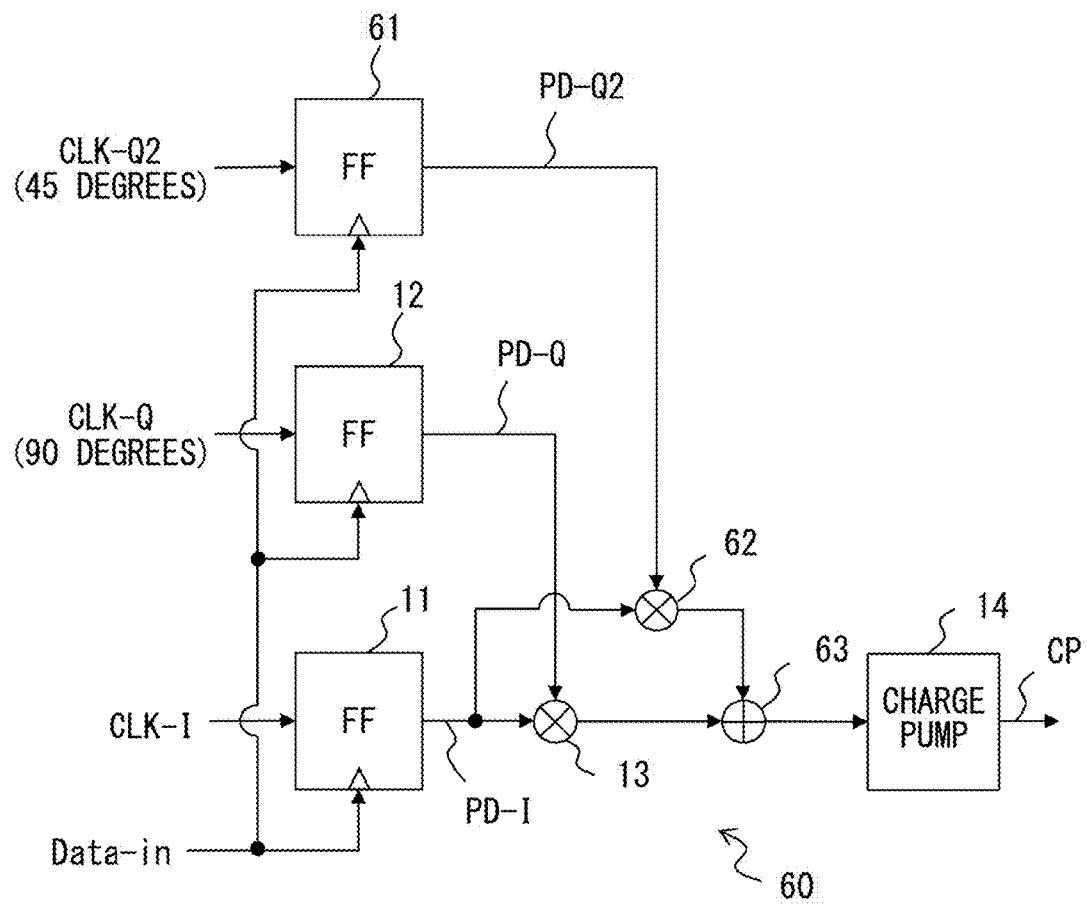
FIG. 17 illustrates an example of a phase detection circuit of a sixth embodiment.

FIG. 17 illustrates an example of a phase detection circuit of the sixth embodiment. A phase detection circuit 60 of the sixth embodiment includes the flip-flops 11 and 12 and a flip-flop 61, the multiplication circuit 13 and a multiplication circuit 62, an addition circuit 63, and the charge pump 14. In other words, in the example of FIG. 17, a clock phase with respect to a data signal is detected by use of three clock signals whose phases are different from one another.

A data signal "Data-in" is provided to each of the C terminals of the flip-flops 11, 12, and 61. Further, clock signals CLK-I, CLK-Q, and CLK-Q2 are provided to each of the D terminals of the flip-flops 11, 12, and 61. The phases of the clock signals CLK-I, CLK-Q, and CLK-Q2 are different from one another. For example, the phase of the clock signal CLK-Q is shifted by 90 degrees with respect to the phase of the clock signal CLK-I, and the phase of the CLK-Q2 is shifted by 45 degrees with respect to the phase of the clock signal CLK-I. In other words, the phase difference between the clock signals CLK-I and CLK-Q2 is half the phase difference between the clock signals CLK-I and CLK-Q. Further, the flip-flops 11 samples the clock single CLK-I with the data signal "Data-in" so as to generate a phase detection signal PD-I. The flip-flop 12 samples the clock single CLK-Q with the data signal "Data-in" so as to generate a phase detection signal PD-Q. The flip-flop samples the clock single CLK-Q2 with the data signal "Data-in" so as to generate a phase detection signal PD-Q2.

The multiplication circuit 13 multiplies the phase detection signal PD-I by the phase detection signal PD-Q. The multiplication circuit 62 multiplies the phase detection signal PD-I by the phase detection signal PD-Q2. The addition circuit 63 generates a sum of an output signal of the multiplication circuit 13 and an output signal of the multiplication circuit 62. In other words, an output signal of the addition circuit 63 is represented by the following formula:

(PD-I)×(PD-Q)+(PD-I)×(PD-Q2)

Then, the charge pump 14 generates a charge pump current corresponding to the output signal of the addition circuit 63.

Figures 18A, 18B, 18C:
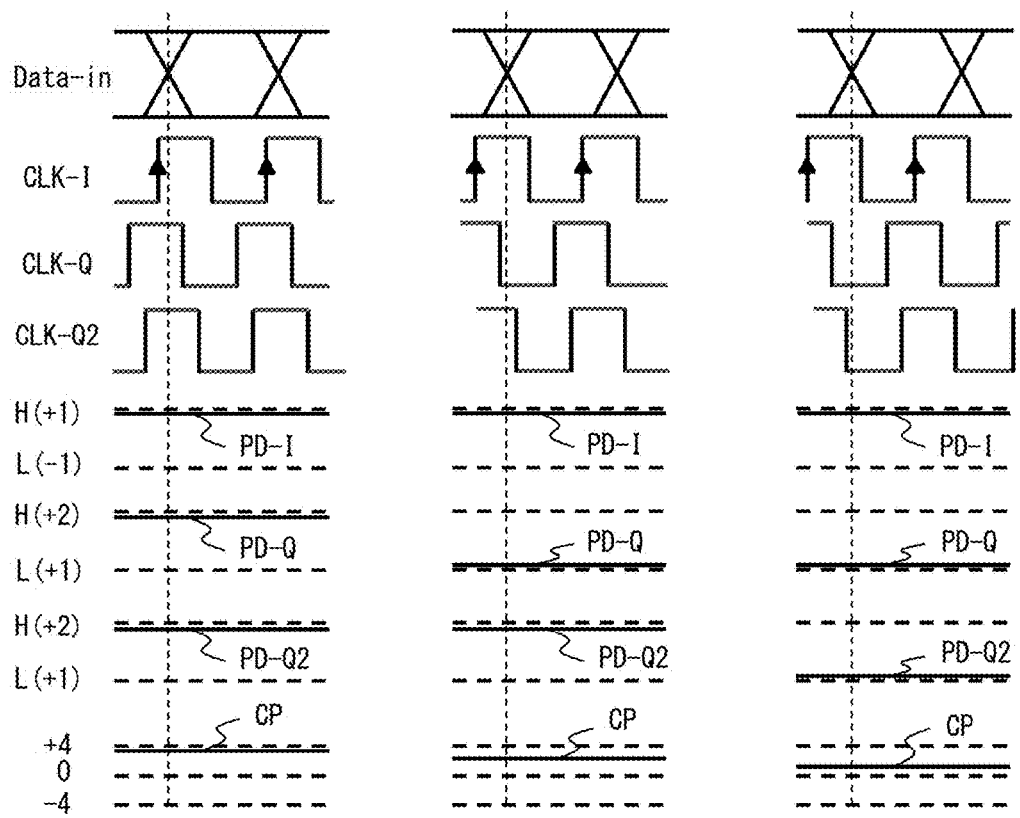
FIGS. 18A-18C illustrate an example of operations of the phase detection circuit of the sixth embodiment.

FIGS. 18A-18C illustrate an example of operations of the phase detection circuit 60 of the sixth embodiment. In FIGS. 18A-18C, dashed lines in a vertical direction represent sampling timings in the flip-flops 11, 12, and 61. The state of the phase detection signal PD-I is "H(+1)" or "L(−1)". Further, the states of the phase detection signals PD-Q and PD-Q2 are "H(+2)" or "L(+1)". In the examples of FIGS. 18A-18C, the phase of the clock signal CLK-I is delayed with respect to the data signal "Data-in". In this case, the state of the phase detection signal PD-I is "H(+1)".

When the delay of the clock signal CLK-I with respect to the data signal "Data-in" is small, both of the phase detection signals PD-Q and PD-Q2 are "L(+1)", as illustrated in FIG. 18C. Thus, the output signal "(PD-I)×(PD-Q)+(PD-I)×(PD-Q2)" of the addition circuit 63 is "2".

When the delay of the clock signal CLK-I with respect to the data signal "Data-in" is large, the phase detection signals PD-Q and PD-Q2 are "L(+1)" and "H(+2)", respectively, as illustrated in FIG. 18B. Thus, the output signal of the addition circuit 63 is "3".

When the delay of the clock signal CLK-I with respect to the data signal "Data-in" is very large, the phase detection signals PD-Q and PD-Q2 are "H(+2)" and "H(+2)", respectively, as illustrated in FIG. 18A. Thus, the output signal of the addition circuit 63 is "4".

The charge pump 14 generates a charge pump current CP corresponding to the output signal of the addition circuit 63. Then, the oscillating frequency of the VCO 15 is controlled according to the charge pump current CP. In other words, the phase of the clock signal CLK-I with respect to the data signal "Data-in" is controlled by the charge pump current CP.

As described above, in the sixth embodiment, it is possible to control a charge pump current more finely with respect to the amount of phase shift, compared with, for example, the case in the first embodiment. In this example, the charge pump current is "2" when the amount of phase shift is smaller than 45 degrees, the charge pump current is "3" when the amount of phase shift is between 45 degrees and 90 degrees, and the charge pump current is "4" when the amount of phase shift is greater than 90 degrees. Thus, the phase of a clock signal for sampling a data signal can be adjusted more accurately.

Other Embodiment

In the example of FIG. 2, a clock signal CLK-Q is generated from a clock signal CLK-I by use of the delay element 17, but the configuration of the present invention is not limited to this configuration. For example, the signal recovery circuit 10 may include a four-phase VCO instead of the VCO 15. The four-phase VCO generates four oscillation signals whose phases are different from one another by 90 degrees. The frequencies of the oscillation signals are the same as one another, each being controlled by a given control signal. A first oscillation signal selected from among the four oscillation signals generated by the four-phase VCO is given to the D terminal of the flip-flop 11 as the clock signal CLK-I. Further, a second oscillation signal whose phase is shifted from the first oscillation signal by 90 degrees is given to the D terminal of the flip-flop 12 as the clock signal CLK-Q.

As described above, according to the first to sixth embodiments or the other embodiment, it is possible to shorten the time needed for performing an adjustment such that the phase of a clock signal with respect to an input data signal is at an optimal point in a signal recovery circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A phase detection circuit comprising:
   a first circuit configured to generate a first phase detection signal that indicates a result of sampling a first clock signal at a transition timing of an input data signal;
   a second circuit configured to generate a second phase detection signal that indicates a result of sampling a second clock signal at the transition timing of the input data signal, a phase of the second clock signal being different from a phase of the first clock signal; and
   a third circuit configured to multiply the first phase detection signal by the second phase detection signal so as to generate a third phase detection signal that indicates a phase of the first clock signal with respect to the input data signal.

2. The phase detection circuit according to claim 1, wherein
   a phase of the second clock signal is shifted by 90 degrees with respect to a phase of the first clock signal.

3. A phase detection circuit comprising:
   a first circuit configured to generate a first phase detection signal that indicates a result of sampling a first clock signal at a transition timing of an input data signal;
   a second circuit configured to generate a second phase detection signal that indicates a result of sampling a second clock signal at the transition timing of the input data signal, a phase of the second clock signal being different from a phase of the first clock signal; and
   a third circuit configured to add the first phase detection signal to a product of the first phase detection signal and the second phase detection signal so as to generate a third phase detection signal that indicates a phase of the first clock signal with respect to the input data signal.

4. A phase detection circuit comprising:
   a first circuit configured to generate a first phase detection signal that indicates a result of sampling a first clock signal at a transition timing of an input data signal;
   a second circuit configured to generate a second phase detection signal that indicates a result of sampling a second clock signal at the transition timing of the input data signal, a phase of the second clock signal being different from a phase of the first clock signal; and
   a third circuit configured to add the first phase detection signal to a product of the first phase detection signal and the second phase detection signal in a specified ratio so as to generate a third phase detection signal that indicates a phase of the first clock signal with respect to the input data signal.

5. A phase detection circuit comprising:
   a first circuit configured to generate a first phase detection signal that indicates a result of sampling a first clock signal at a transition timing of an input data signal;
   a second circuit configured to generate a second phase detection signal that indicates a result of sampling a second clock signal at the transition timing of the input data signal, a phase of the second clock signal being different from a phase of the first clock signal; and
   a third circuit configured to generate a third phase detection signal that indicates a phase of the first clock signal with respect to the input data signal based on the first phase detection signal and the second phase detection signal, wherein
   the third circuit includes a charge pump circuit that generates charge pump current to indicate a result of addition of the first phase detection signal to a product of the first phase detection signal and the second phase detection signal in a specified ratio, and the third circuit outputs the charge pump current generated by the charge pump circuit as the third phase detection signal.

6. The phase detection circuit according to claim 1 further comprising
a smoothing circuit, implemented between the second circuit and the third circuit, configured to smooth the second phase detection signal.

7. The phase detection circuit according to claim 1 further comprising
a delay circuit configured to delay the first clock signal to generate the second clock signal.

8. The phase detection circuit according to claim 1 further comprising
a voltage controlled oscillator configured to generate four oscillation signals of an oscillating frequency corresponding to control voltage generated based on the third phase detection signal, phases of the four oscillation signals being shifted from each other by 90 degrees, wherein
one of the four oscillation signals is used as the first clock signal and another one of the four oscillation signals is used as the second clock signal.

9. A phase detection circuit comprising:
a first circuit configured to generate a first phase detection signal that indicates a result of sampling a first clock signal at a transition timing of an input data signal;
a second circuit configured to generate a second phase detection signal that indicates a result of sampling a second clock signal at the transition timing of the input data signal, a phase of the second clock signal being shifted by 90 degrees with respect to a phase of the first clock signal;
a third circuit configured to generate a third phase detection signal that indicates a result of sampling a third clock signal at the transition timing of the input data signal, a phase of the third clock signal being shifted by 45 degrees with respect to the phase of the first clock signal;
a first multiplication circuit configured to multiply the first phase detection signal and the second phase detection signal so as to generate a first product;
a second multiplication circuit configured to multiply the first phase detection signal and the third phase detection signal so as to generate a second product; and
an addition circuit configured to add the first product to the second product so as to generate a fourth phase detection signal that indicates a phase of the clock signal with respect to the input data signal.

10. A signal recovery circuit comprising:
an oscillator configured to generate a first clock signal of an oscillating frequency corresponding to a control signal;
a data recovery circuit configured to sample an input data signal with the first clock signal so as to recover the input data signal; and
a phase detection circuit configured to detect a phase of the first clock signal with respect to the input data signal, wherein
the phase detection circuit includes:
a first circuit configured to generate a first phase detection signal that indicates a result of sampling the first clock signal at a transition timing of the input data signal;
a second circuit configured to generate a second phase detection signal that indicates a result of sampling a second clock signal at the transition timing of the input data signal, a phase of the second clock signal being different from a phase of the first clock signal; and
a third circuit configured to multiply the first phase detection signal by the second phase detection signal so as to generate the control signal.

* * * * *